(12) United States Patent
Harpe

(10) Patent No.: US 8,368,578 B2
(45) Date of Patent: Feb. 5, 2013

(54) ASYNCHRONOUS DIGITAL SLOPE ANALOG-TO-DIGITAL CONVERTER AND METHOD THEREOF

(75) Inventor: Pieter Harpe, Eindhoven (NL)

(73) Assignee: IMEC, Leuven (BE)

( * ) Notice: Subject to any disclaimer, the term of this patent is extended or adjusted under 35 U.S.C. 154(b) by 71 days.

(21) Appl. No.: 13/113,884

(22) Filed: May 23, 2011

(65) Prior Publication Data

US 2011/0285568 A1 Nov. 24, 2011

Related U.S. Application Data

(60) Provisional application No. 61/347,280, filed on May 21, 2010.

(51) Int. Cl.
*H03M 1/12* (2006.01)
(52) U.S. Cl. ........ 341/172; 341/118; 341/120; 341/155; 341/169
(58) Field of Classification Search .................. 341/169, 341/172, 118, 120, 155
See application file for complete search history.

(56) References Cited

U.S. PATENT DOCUMENTS

| | | | |
|---|---|---|---|
| 4,369,433 A * | 1/1983 | Yamakido ..................... 341/150 |
| 4,928,308 A * | 5/1990 | Roessler .................. 379/406.08 |
| 4,985,702 A | 1/1991 | Penney |
| 5,175,452 A | 12/1992 | Lupi et al. |
| 5,369,407 A * | 11/1994 | Yung et al. .................... 341/172 |
| 5,933,039 A | 8/1999 | Hui et al. |
| 6,646,583 B1 * | 11/2003 | Fossum et al. ................. 341/144 |
| 6,714,151 B2 * | 3/2004 | Tachibana et al. ............ 341/155 |
| 6,940,445 B2 * | 9/2005 | Kearney ........................ 341/163 |
| 7,098,840 B2 * | 8/2006 | Arigliano ...................... 341/172 |
| 7,106,239 B1 | 9/2006 | Keskin |
| 7,315,270 B2 | 1/2008 | Maksimovic et al. |
| 7,663,518 B2 * | 2/2010 | Hurrell ......................... 341/131 |
| 7,773,023 B2 * | 8/2010 | Dosho et al. .................. 341/163 |
| 2003/0234736 A1 * | 12/2003 | Tachibana et al. ............ 341/172 |
| 2008/0238652 A1 | 10/2008 | Henzler et al. |
| 2010/0026545 A1 | 2/2010 | Delagnes |
| 2010/0052957 A1 * | 3/2010 | Craninckx .................... 341/122 |

FOREIGN PATENT DOCUMENTS

EP 0564143 A2 10/1993

OTHER PUBLICATIONS

European Search Report, European Patent Application 10188828.7, dated Jan. 28, 2011.

(Continued)

*Primary Examiner* — Linh Nguyen
(74) *Attorney, Agent, or Firm* — McDonnell Boehnen Hulbert & Berghoff LLP

(57) ABSTRACT

The present invention is related to an analog to digital converter circuit. The circuit comprises at least one input node for applying an analog input voltage signal ($V_{in}$), means for sampling said analog input voltage signal, a first array of capacitors arranged for receiving the sampled analog input voltage signal, a digital delay line connected to the first array of capacitors and arranged for being enabled by a clock generator and for generating a staircase or slope function by means of the first capacitor array, taking into account the sampled analog input voltage signal, a comparator arranged for comparing a converted signal with a reference voltage ($V_{ref}$), said converted signal being a version of said sampled analog input voltage converted according to said staircase or slope function, and for generating a stop signal based on the comparison result thereby latching the digital delay line and thereby acquiring the digital code.

11 Claims, 8 Drawing Sheets

OTHER PUBLICATIONS

Ginsburg, Brian P., "Energy-Efficient Analog-to-Digital Conversion for Ultra-Wideband Radio", Department of Electrical Engineering and Computer Science, Massachusetts Institute of Technology, Jul. 2007, pp. 1-222.

Tousi, Yahya M. et al., "A 1mW 4b 1GS/s Delay-Line Based Analog-to-Digital Converter", IEEE, 2009, pp. 1121-1124.

Ginsburg, B.P. et al., "Highly Interleaved 5-bit, 250-MSamples/s, 1.2-mW ADC with Redundant Channels in 65-nm CMOS," IEEE J. Solid-State Circuits, vol. 43, No. 12, pp. 2641-2650, Dec. 2008.

Lin, Ying-Zu et al., "A 5b 800MS/s, 2mW Asynchronous Binary-Search ADC in 65nm CMOS," ISSCC Dig. Tec. Papers, pp. 80-81, Feb. 2009.

Verbruggen, B. et al., "A 2.6mW 6b 2.2GS/s 4-times Interleaved Fully Dynamic Pipelined ADC in 40nm Digital CMOS," ISSCC Dig. Tech. Papers, pp. 296-297, Feb. 2010.

* cited by examiner

ASYNCHRONOUS DIGITAL SLOPE ANALOG-TO-DIGITAL CONVERTER AND METHOD THEREOF

CROSS-REFERENCE TO RELATED APPLICATIONS

This application claims priority to U.S. Provisional Application Ser. No. 61/347,280 filed on May 21, 2010. This application also claims priority under 35 U.S.C. §119 to European Application EP 10188828.7 filed on Mar. 24, 2011. The entire contents of the 61/347,280 and EP 10188828.7 applications are incorporated herein by reference.

TECHNICAL FIELD

The present invention generally relates to a method and a device for converting an analog signal into a digital signal. In particular, the invention relates to an asynchronous clocked slope analog-to-digital converter.

BACKGROUND

For applications like ultra low power radio receivers, analog-to-digital converters (ADC) with a low resolution (4 or 5 bits) and high speed of operation (at least 500 MS/s) are required. Especially, the power efficiency of the ADC is important, since the overall radio's power consumption should be minimized. Current low resolution ADCs are typically not power efficient, unless a substantial amount of calibration is used. For high-speed (>100 MS/s), low-resolution (4 to 6 bits) ADCs typically flash or folding topologies are used. However, these architectures are not the most power efficient ones.

An important aspect for an ADC's power consumption is the number of comparisons required for each conversion. Table 1 shows an overview of the amount of comparisons per conversion for various ADC architectures, assuming an N-bit resolution.

TABLE 1

| Architecture | Comparisons per conversion |
| --- | --- |
| Flash | $2^N$ |
| Folding | $2^{N-M}$ |
| Pipeline | $N \ldots 2^N$ |
| SAR, binary-search | N |
| Slope/ramp | 1 |

For high-speed (>100 MS/s), low-resolution (4-6 bit) ND converters, typically flash or folding topologies are used. However, based on Table 1, it can be expected that these architectures are not the most power-efficient ones. Current state-of-the-art converters can achieve power efficiencies in the order of 40-200 fJ per conversion step. However, this is only achievable when using substantial calibration techniques to correct for the comparator offsets. In reality, this calibration can be cumbersome and strongly dependent on environmental conditions (temperature, supply voltage). Without calibration, the power efficiency would be significantly degraded.

Document EP 0564143 A2 relates to a multi-mode successive approximation analog-to-digital converter that converts an analog input signal into a digital value according to a linear or companding transfer function. The converter comprises a comparator, a successive approximation register and a charge redistribution device. A plurality of capacitors of different size is used whereby the capacitor terminals on one side are selectively connected to a different reference voltage in a successive approximation approach.

U.S. Pat. No. 4,985,702 discloses an ND converter with second error correction that provides a more accurate digital output code for a HF input analog signal. A slope (i.e. slew rate) of the input signal is determined from the digital output code of a quantizer and the slope is used to provide a correction value that is a function of the slope.

In U.S. Pat. No. 5,933,039 a digital signal delay line is presented with electrically programmable and trimmable delay times, including electrically erasable and reprogrammable delay times.

SUMMARY

The present invention aims to provide a high-speed, low-resolution A/D converter with a good power efficiency and with a limited use of calibration techniques. It is a further aim to provide a simple architecture which is also future-proof by using a mostly digital implementation.

The present invention relates in a first aspect to an analog to digital converter arranged for converting an analog input signal into a digital code representative of this analog signal. The A/D converter comprises at least one input node for applying the analog input signal and sampling means for sampling the input signal. The sampled version of the input signal is then applied to a first array of capacitors. Connected to this array of capacitors is a digital delay line having a plurality of stages. The delay line can be enabled by a clock generator and is also arranged for generating a slope or staircase function by means of the first capacitor array. The sampled analog input voltage is hereby taken into account, as it determines the starting point of the slope or staircase function. The ADC circuit also comprises a comparator arranged for comparing a converted signal with a reference voltage and for generating a stop signal based on the comparison result thereby latching the digital delay line and thereby acquiring the digital code representative of the analog input voltage signal. The converted signal is a version of the sampled analog input voltage converted according to the slope or staircase function.

The slope ADC is able to operate at a much higher speed by generating the slope in the digital domain with an asynchronous delay line. Since this architecture does not require an oversampled clock as in traditional slope or ramp ADCs, but only a sample-rate clock, the speed of operation can be increased, making the architecture more suitable for high-speed applications.

According to an embodiment the A/D converter may further comprise at least a first capacitor connected to the first stage of the delay line. The first capacitor is preferably programmable. By changing the value of this at least first capacitor, the signal range can be shifted, which effectively corresponds to offset-tuning of the converter. This programmability provides a means of offset-correction which can be used to compensate the offset or the delay variation of the comparator.

In a preferred embodiment a differential implementation is provided. The analog to digital converter then comprises a first and a second input node arranged for receiving a differential input signal (i.e., a differential voltage of the analog input signal). The sampling means then yields a sampled differential input voltage. The first array of capacitors and a second array of capacitors receive the sampled differential input voltage signal. The digital delay line is arranged for being enabled by a clock generator and is connected to the first and the second array of capacitors. It is further arranged for generating a slope or staircase function by means of the first and second capacitor array. A comparator is arranged for comparing the voltage on the first input node with the voltage on the second input node and for generating a stop signal based on the comparison result thereby latching the digital delay line and thereby acquiring the digital code.

The converter according to this embodiment may further comprise at least a first capacitor and a second capacitor connected to the first stage of the delay line and arranged for redistributing the input signal thereby translating/transforming the analog signal into a positive analog input signal. Furthermore, the first and second capacitors are preferably programmable and provide a means of offset-correction.

In an advantageous embodiment extra capacitors are added to the first stage of the delay line to accommodate for negative input voltages. Since these capacitors are cross-coupled compared to the other capacitors, they create a step function with opposite sign.

In an embodiment the digital delay line comprises delay cells connected in series with each other and in parallel via the capacitors of the first capacitor array to the at least first input node, each of the delay cells being enabled by means of the clock generator and latched by means of the comparator's outputted stop signal.

In an embodiment the digital delay line comprises $2^N$ delay cells, with N the required resolution. In another embodiment the delay line comprises $M > 2^N$ delay cells.

In an embodiment an implementation as a time-interleaved converter is provided comprising a plurality of converters as proposed before. The time-interleaved converter may further comprise a calibration circuit arranged for calibrating the comparator in the time-interleaved converter. The calibration circuit may comprise programmable capacitors (for example first and second capacitor), digital logic and switches for resetting the input.

In an embodiment the first and second capacitors are digitally programmable.

In an embodiment the analog to digital converter may further comprise a thermometer to gray encoder for encoding the digital code. In another embodiment, the analog to digital converter may further comprise a thermometer to binary encoder for encoding the digital code.

In an embodiment the delay cells are dynamic memory elements.

In another aspect the invention relates to a method for converting an analog signal into a digital representation of this analog input signal. The method comprises the steps of sampling the analog input signal onto an array of capacitors, activating/enabling a digital delay line thereby producing a slope or staircase function by means of the capacitor array, comparing a converted signal with a reference voltage ($V_{ref}$), by means of a comparator, latching the delay line based on the outcome of the comparison and storing the latched code. The converted signal is a version of the sampled analog input voltage converted according to the staircase or slope function.

BRIEF DESCRIPTION OF THE FIGURES

Presently preferred embodiments are described below in conjunction with the appended drawing figures, wherein like reference numerals refer to like elements in the various figures.

DETAILED DESCRIPTION OF THE FIGURES

Figure 1:
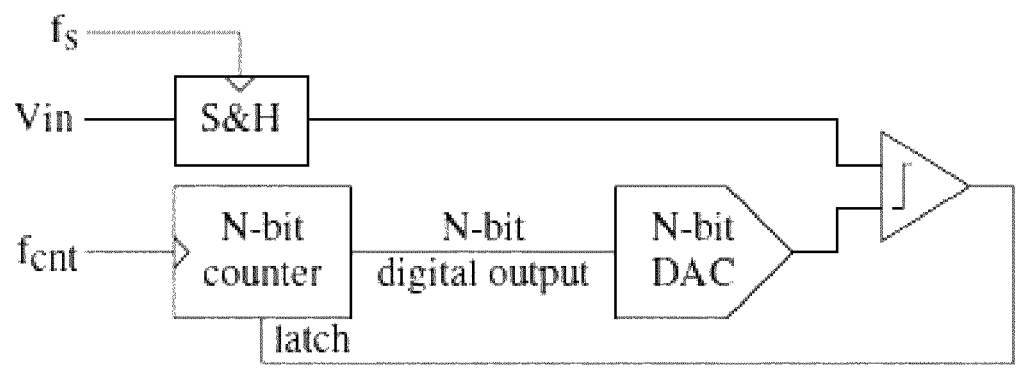
FIG. 1 shows a digital ramp analog to digital converter architecture (prior art).

The present invention will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting of only components A and B. It means that with respect to the present invention, the only relevant components of the device are A and B.

The basic principle of the architecture proposed in the invention is based on a slope ADC. Fundamentally (see Table 1), this architecture is able to achieve a good power efficiency, since only one comparison per conversion is required, regardless of the resolution N of the ADC. Moreover, it also implies that at most a single comparator threshold needs to be calibrated instead of $2^N-1$ comparators in case of a flash ADC. However, prior art slope ADCs are suitable only for low-speed applications since they require a high-speed over-sampled clock ($2^N$ times the sample frequency).

This invention enables a much higher speed of operation of the slope ADC by generating the slope in the digital domain with an asynchronous delay line. Since this architecture does not require an oversampled clock as compared to traditional slope or ramp ADCs, but only a sample-rate clock, the speed of operation can be increased, making the architecture more suitable for high-speed applications.

A diagram of a typical digital ramp ADC is shown in FIG. 1. The sampling clock $f_s$ samples the input signal. A counter, operating at $f_{cnt}=2^N \cdot f_s$, generates a digital ramp that is converted to the analog domain by a DAC. A comparator latches the counter as soon as the DAC output equals the sampled value, thus creating a digital output code proportional to the applied input voltage. In a similar way, a slope ADC uses an analog integrator instead of a DAC to generate the ramp function. However, for both architectures, the sampling speed is severely limited due to the required high-speed oversampled clock $f_{cnt}$, which results in high-speed logic and a high-speed comparator. Current state-of-the-art designs achieve 10 to 12 bit resolution and sampling rates in the order of 100 kS/s.

Based on existing work, it is not obvious to select a ramp architecture for low-resolution, high-speed applications. Nonetheless, a ramp architecture is a worthwhile candidate when aiming at good power efficiency without calibration, since:

The architecture requires only one comparison per conversion (regardless of the resolution N) and has a low design complexity, thus potentially enabling a very good power efficiency.

The architecture provides intrinsic accuracy since there is only one comparator involved while a linear ramp can be implemented accurately, thus no calibration is required. Optionally, the comparator offset could be calibrated. Since this is a single-point calibration which can be done with a zero-input reference. This calibration can be implemented easily on-chip, as opposed to the calibration techniques for flash or pipelined converters.

The speed limitation is resolved by introducing an asynchronous architecture that eliminates the oversampled clock $f_{cnt}$.

Figure 2A:
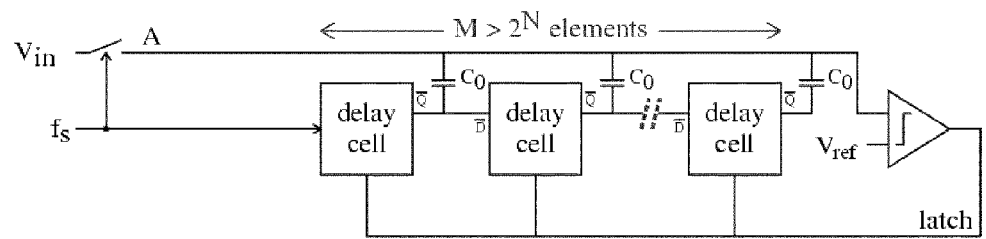
FIG. 2A shows a single-ended signal being compared with a reference voltage.

An embodiment of an asynchronous slope analog to digital converter of the invention is illustrated in FIG. 2A. The converter comprises at least a first array of capacitors connected to at least one input node, a digital delay line connected to the first array of capacitors and arranged for generating a linear slope or staircase function by means of the first capacitor array, a clock generator arranged for enabling the digital delay line, a comparator arranged for comparing the sampled voltage (of the analog input signal) on the at least one input node with a reference voltage and for generating a stop signal based on the comparison result thereby latching the digital delay line and thereby acquiring the digital code.

Figure 2B:
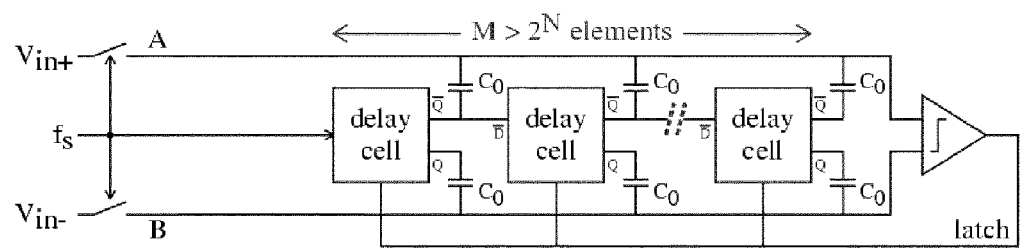
FIG. 2B illustrates a differential solution suitable for positive input signals only. The scheme of FIG. 2C is operable for both positive and negative input signals, as it comprises a bipolar-to-unipolar converter.

A second embodiment is illustrated in FIG. 2B, the analog to digital converter comprises a first array of capacitors connected to a first input node, a second array of capacitors connected to a second input node whereby the first and second input nodes are arranged for receiving a differential input signal (differential voltage of analog input signal), a digital delay line connected to the first array of capacitors and to the second array of capacitors and arranged for generating a dual-slope or dual staircase function by means of the first capacitor array and a second capacitor array, a clock generator arranged for enabling the digital delay line, a comparator arranged for comparing the voltage on the first input node with the voltage on the second input node and for generating a stop signal based on the comparison result thereby latching the digital delay line and thereby acquiring the digital code.

Figure 2C:
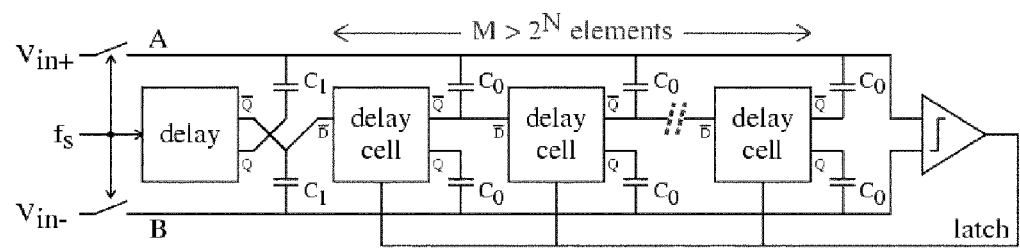
FIG. 2 represents an asynchronous slope analog to digital converter according to some embodiments of the invention.
Figure 3:
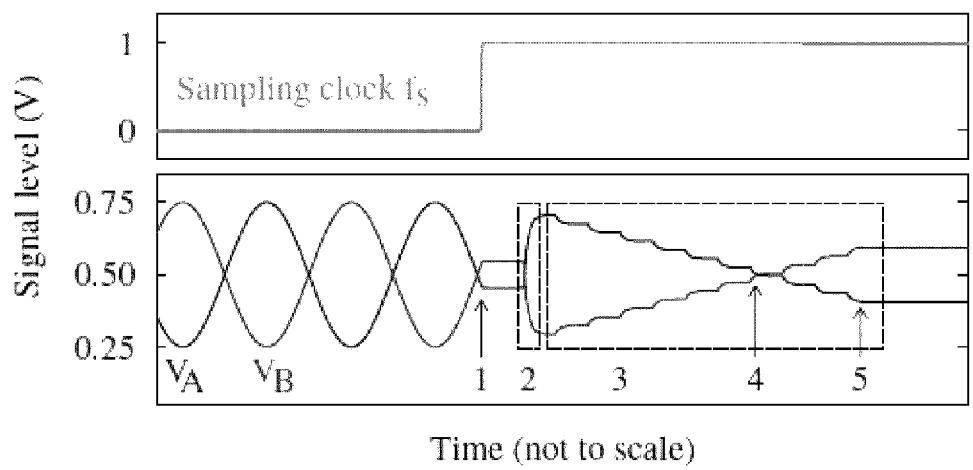
FIG. 3 illustrates the behaviour of the converter according to an embodiment, in the time domain.

The converter according to the second embodiment may further comprise two large capacitors. This embodiment will be explained more in detail and is illustrated by FIG. 2C, while its behaviour is illustrated in FIG. 3. First, the bipolar differential input signal is sampled on the array of capacitors (1). During phase (2), by means of charge redistribution through capacitors (first and second capacitors) $C_1$, the bipolar input range $[-V_{max}; +V_{max}]$ is shifted to a unipolar input range $[0; +2V_{max}]$, such that $V_A \geq V_B$ before the actual conversion starts. Then, in phase (3), the digital delay line is activated: like dominos, the cells will switch one by one from a logical 0 to a logical 1. Through the capacitors (of the first and second array) $C_0$, the delay line produces a differential slope, as illustrated in FIG. 3. In summary, the delay line generates an analogue staircase function in the capacitor array and a digital staircase function in the delay cells. Note that the delay line operates asynchronously, thus enabling a high-speed digitally generated slope triggered by a low-speed sample rate clock. Moreover, the lack of a clock-tree in this asynchronous design reduces the power consumption. As soon as $V_A < V_B$ (4), the output of the comparator toggles and latches the delay line at its current position. The latched thermometer code, stored in the delay line, is proportional to the input voltage and thus provides the required digital output. Because of the comparator latency, the moment of latching (5) is delayed compared to the crossing-point (4). For that reason, the delay line is extended with several additional cells (thus $M>2^N$) to prevent saturation at the end of the range. By doing so, the constant latency simply translates to a constant code shift of the A/D converter which does not degrade the performance. In the example presented below the overhead in delay cells due to comparator latency is about 12%. Since the comparator operates without a clock and the latency is tolerated by design, the speed of the comparator can be slow compared to the latency of the delay cells, thus enabling a higher overall speed.

Even though the latency of the delay cells is dependent on temperature, process corners and supply voltage, the accuracy of this architecture is insensitive to these variations: since the same delay-cells generate the analog waveform and the digital thermometer code simultaneously, any latency variation affects the analog ramp and the digital code in the same way. Thus, even though the overall duration of the conversion might change, the mapping from analog input to digital output remains the same and hence the accuracy is maintained regardless of the latency variation.

Figure 4:
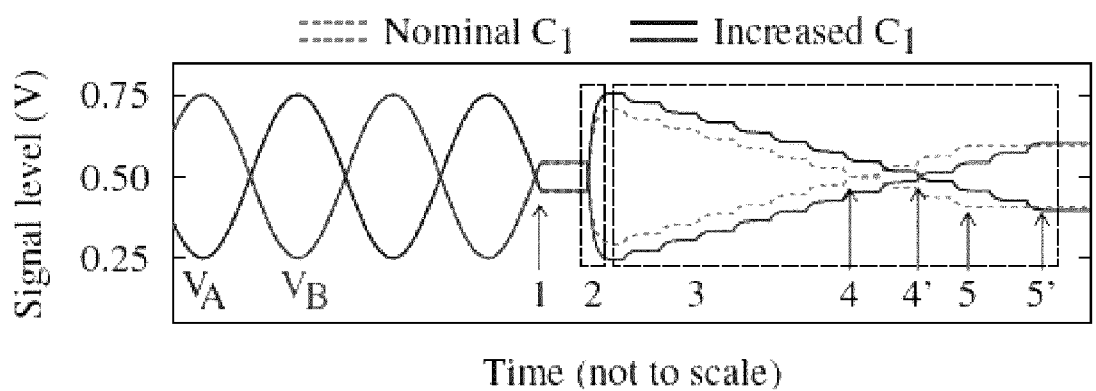
FIG. 4 illustrates the behaviour of the converter according to another embodiment, in the time domain.

In certain situations, e.g. time-interleaved converters, it can be required to calibrate the ADC offset. Since the proposed architecture contains only one comparator, a simple single-point calibration is sufficient. To implement offset correction, capacitors $C_1$ (FIG. 2) are made digitally programmable. By tuning $C_1$, the signal-shift during phase (2) can be altered, as shown by the example in FIG. 4: when increasing $C_1$, an additional step is added to $V_A - V_B$, such that the crossing-point (4') is delayed as well as the moment of latching (5'), thus resulting in a shifted output code. By applying a zero-input to the ADC and tuning $C_1$ until the output code reaches mid-scale, the offset can be calibrated. Since a latency variation of the comparator also manifests itself as a shift of the output code, the calibration method will automatically compensate for the comparator latency error as well.

Figure 5:
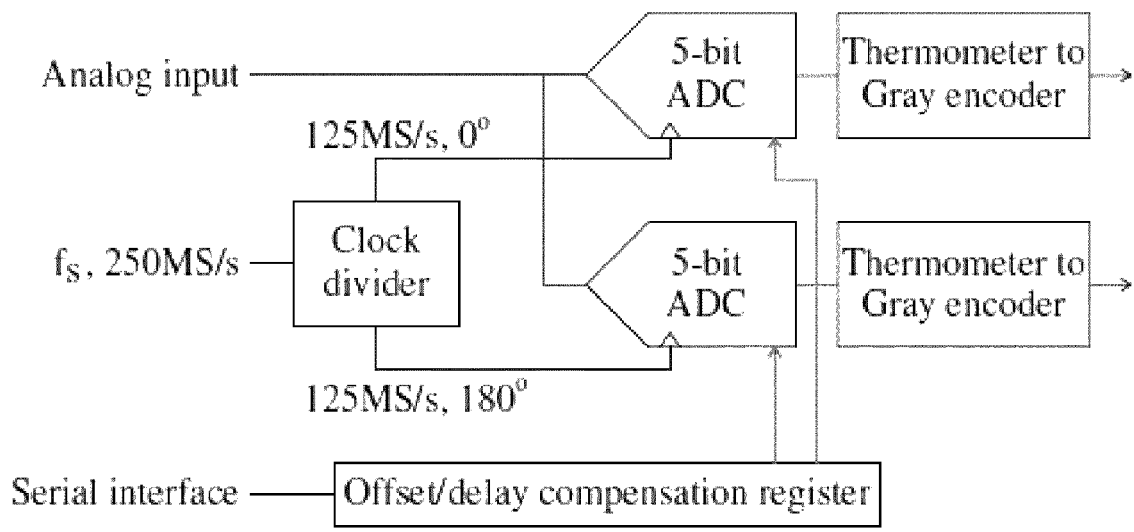
FIG. 5 shows a block diagram of a possible implementation according to a further embodiment.

The present architecture will be exemplified by a possible implementation. FIG. 5 gives an overview of an implementation in 90 nm CMOS containing a 2-channel 250 MS/s time-interleaved ADC. Each channel uses a 5 bit asynchronous digital slope ADC, operating at 125 MS/s and implemented as shown previously in FIG. 2. Also, a clock divider is included as well as thermometer to gray encoders and a digital register allowing control of the $C_1$ capacitors for offset/delay calibration.

Figure 6:
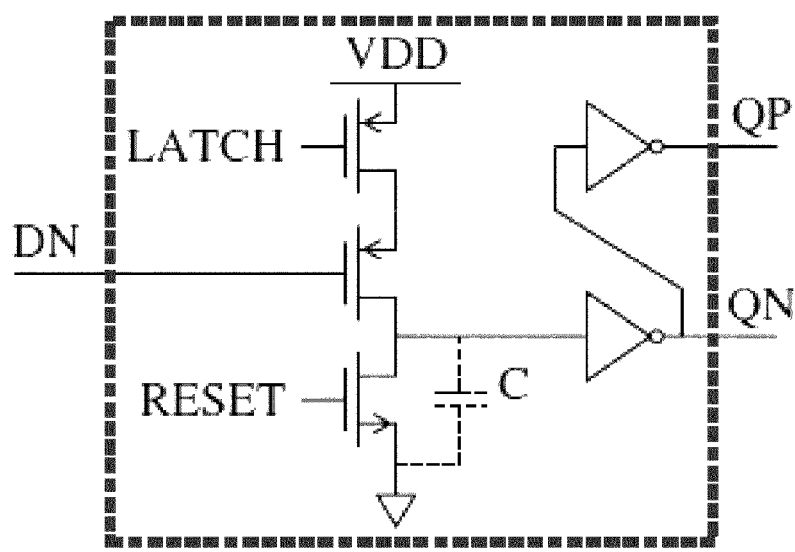
FIG. 6 illustrates a delay cell according to an embodiment of the invention.

The design of the delay line and capacitor network is crucial for high-speed and low-power operation. FIG. 6 shows the implementation of a delay cell. It is composed of a dynamic memory element and two inverters to create the differential output. The 1-bit memory element is implemented by capacitor C, which is simply the parasitic capacitance of the node, caused by the connected transistors plus wiring. Upon RESET, the element is precharged low. The delay cell is activated by a falling edge on input DN, which is generated by the preceding element in the delay line. At that moment, DN charges C to a high-level and the output changes state. This causes a step of the analog ramp and it activates the next element of the delay line. As soon as the comparator latches, the LATCH input will go high, thus disabling input DN, and freezing all delay cells at their present state. The simple implementation of the memory element (with only three transistors) results in a low power consumption and it enables high speed operation. In total, 44 delay cells are implemented in this example to accommodate for comparator latency and to provide additional range for calibration. In this prototype, the delay of each cell is 110 ps, leading to a duration of almost 5 ns for the complete slope. Though the cells could be made faster in the given technology, the achieved speed is sufficient for a sampling rate of 125 MS/s.

Since the matching and kT/C-noise requirements are relatively relaxed for 5 bit performance, the capacitors creating the ramp function can be minimized in value and area to minimize the power consumption. To do so, custom-designed lateral metal-metal capacitors can be implemented. The capacitor-value is designed to be 0.5 fF. The pitch of the capacitors (for example 1.12 µm) is designed to match the width of the digital delay cells. By doing so, the capacitors can be placed on top of the delay cells to minimize the wiring parasitics. Also, it allows the implementation of an area-efficient array of cells to construct the overall delay line. Because of the small capacitors, the total input-referred capacitance of the ADC for this illustrative implementation is only 40 fF.

Figure 7:
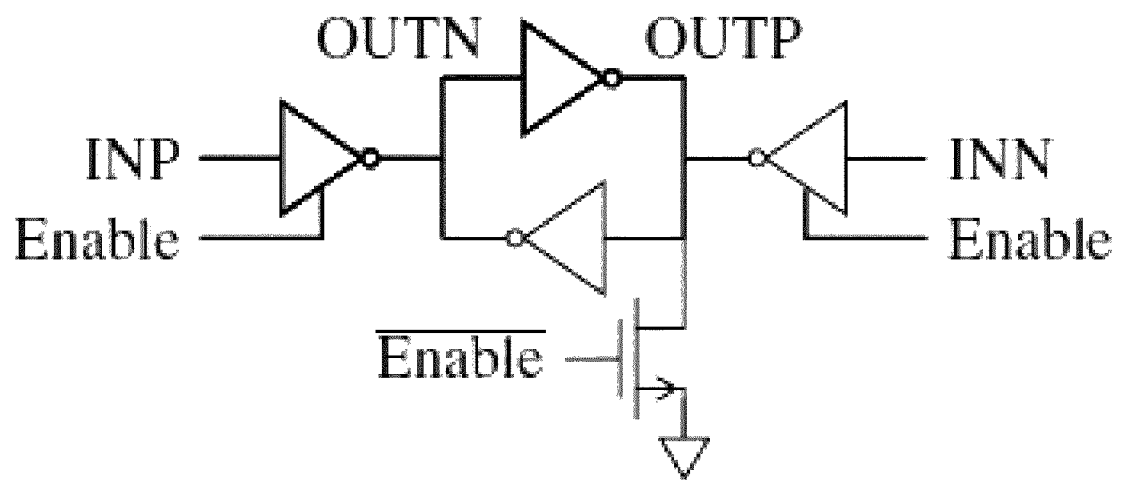
FIG. 7 illustrates an example of a comparator as used in another embodiment.
Figure 8:
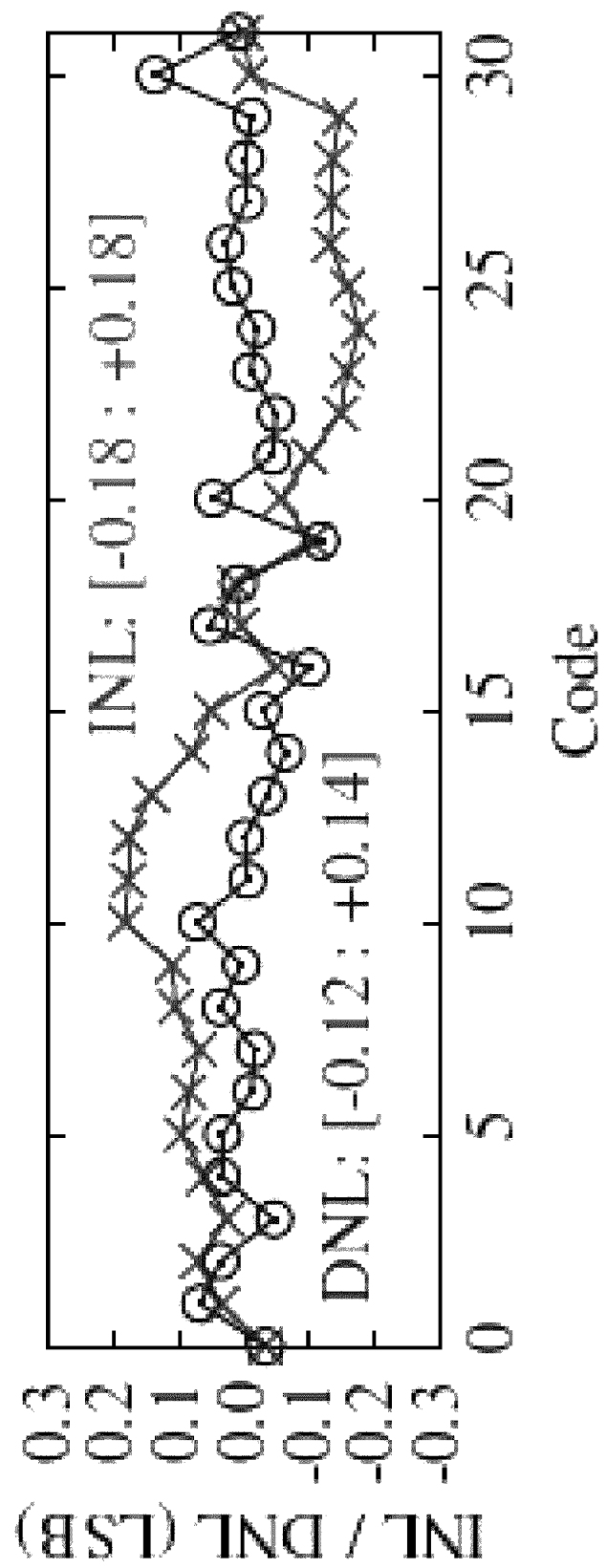
FIG. 8 shows a plot of the measured INL and DNL of the proposed converter.

The two-stage clockless comparator is implemented as shown in FIG. 7: two inverters act as pre-amplifier, while a cross-coupled inverter pair is used for the second stage. After each conversion, the comparator is disabled to reduce the power consumption by turning off the first stage. Also, the second stage is reset to remove possible memory effects, thereby ensuring that the comparator latency remains constant from one conversion to the other. The simulated comparator latency is 420 ps, corresponding to the latency of approximately 4 delay cells. The ADC performance was measured at 250 MS/s with a 1V supply. For all measurements the offset compensation register was loaded with the default value, thus no calibration is used. The measured integral non-linearity (INL) and differential non-linearity (DNL) are shown in FIG. 8, reaching a maximum error of 0.18 LSB.

Figure 9:
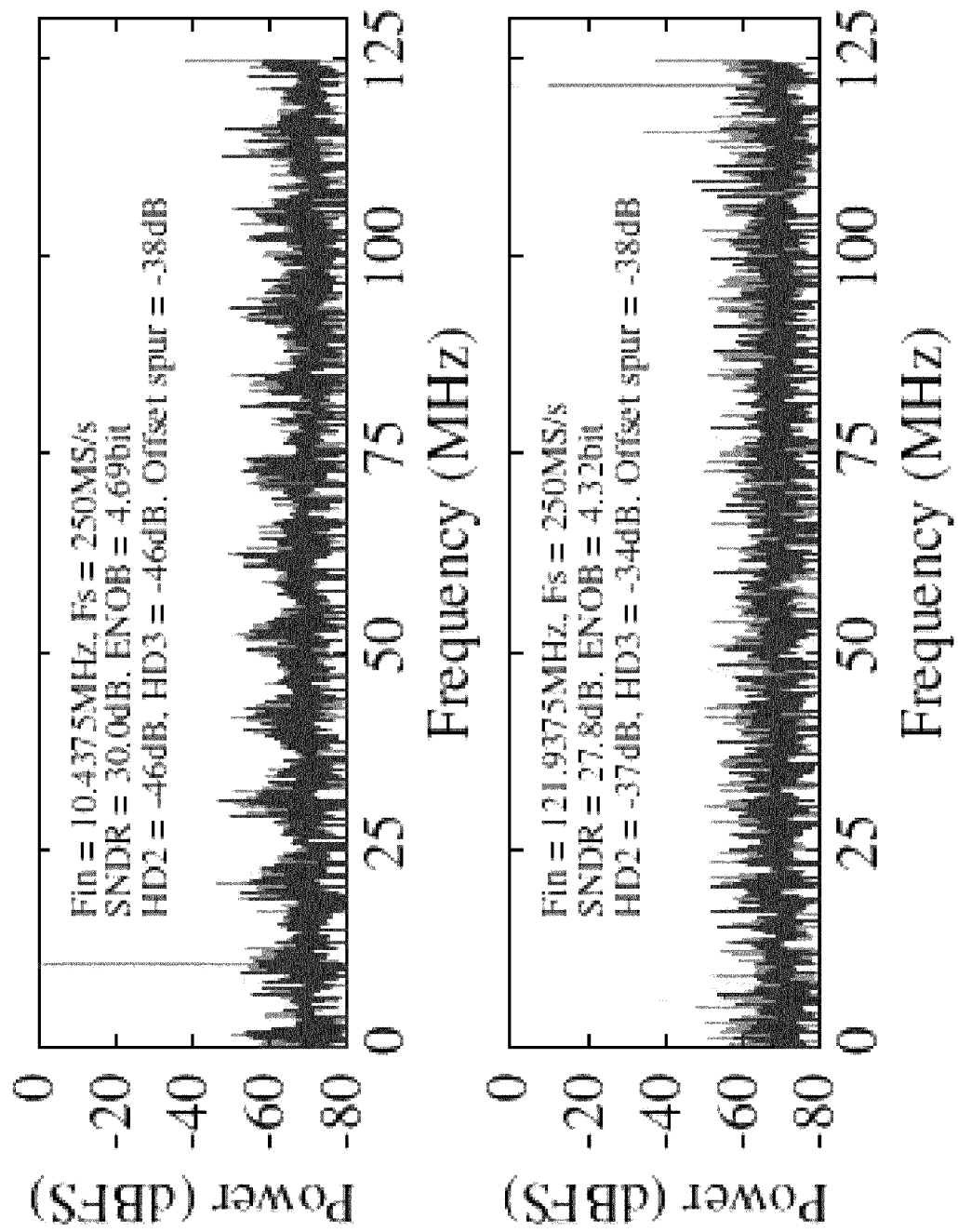
FIG. 9 shows plots to illustrate the dynamic performance.
Figure 10:
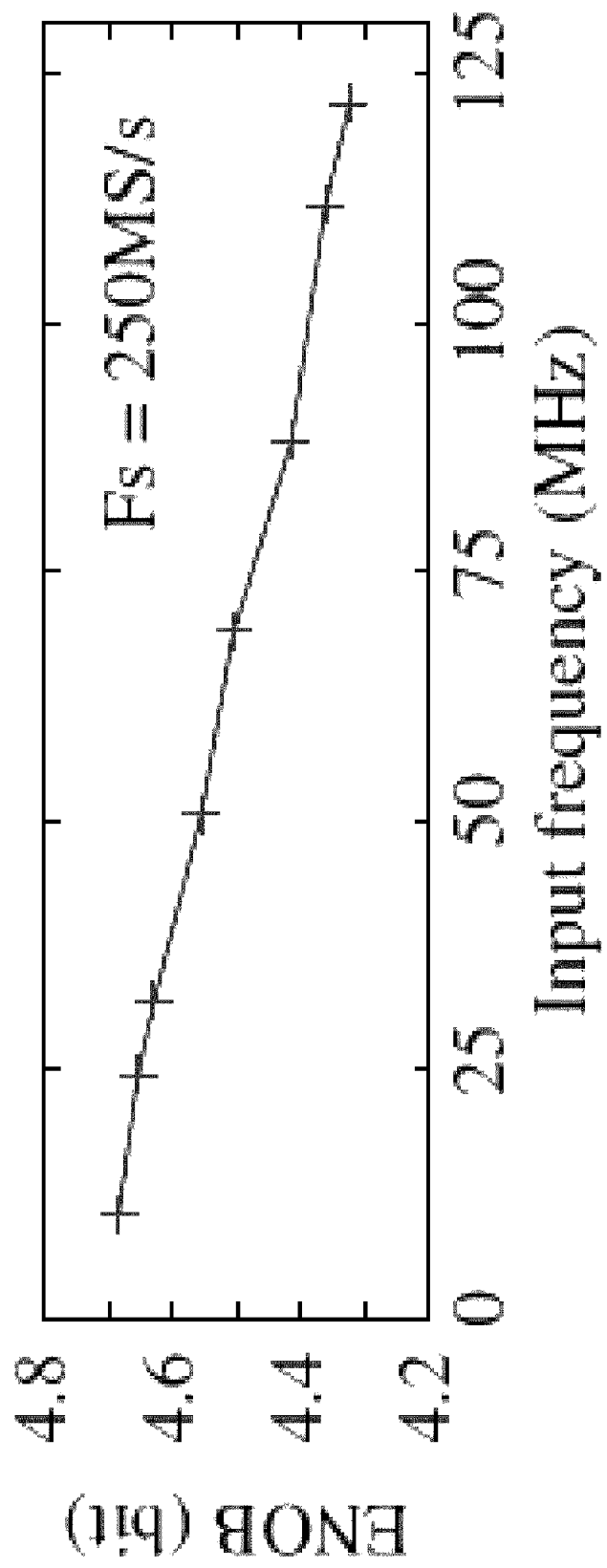
FIG. 10 shows a measured effective number of bits (ENOB) as a function of the applied input frequency.

The dynamic performance was verified by applying single-tone inputs. FIG. 9 shows two measured spectra: a modulated spur due to offset can be seen, which is however negligible for 5 bit performance, thus revealing that no calibration is required to achieve the target accuracy. No tones due to time-skew or gain-error can be observed, which demonstrates that the two channels are properly matched. FIG. 10 shows the measured effective number of bits (ENOB) as a function of the applied input frequency. The low frequency ENOB equals 4.6 bit, while the effective resolution bandwidth ERBW is beyond Nyquist. The measured power consumption (including clock divider and thermometer to gray encoders) is 0.8 mW, yielding a FoM (Figure of Merit) of 130 fJ per conversion step.

Table 2 shows the performance summary and comparison. Without optimization, the performance of this prototype is already close to state-of-the-art. Since this design is mainly based on digital cells, circuit optimization and down-scaling to a newer technology gives a significant performance improvement. At the same time, the presented work provides a very small input capacitance while it does not require calibration. With these two properties, this design is very suitable to minimize the complexity and overall power consumption of an integrated wireless receiver.

TABLE 2

| Reference | Ref1 | Ref2 | Ref3 | This work |
|---|---|---|---|---|
| Technology | 40 nm | 65 nm | 65 nm | 90 nm |
| Power supply (V) | 1.1 | 0.8 & 1.2 | 1.0 | 1.0 |
| Power consumption (mW) | 2.6 | 1.2 | 2.0 | 0.8 |
| Common-mode level (V) | <0.4 | — | 0.8 | 0.5 |
| Signal range ($V_{pp\text{-}diff}$) | 0.6 | 0.7 | 0.6 | 0.5 |
| Sampling capacitance (fF) | 40 | — | 1000 | 40 |
| Sample frequency (GS/s) | 2.2 | 0.25 | 0.8 | 0.25 |
| ENOB (bit) | 4.9 | 4.6 | 4.4 | 4.6 |
| FoM (fJ/Conversion-step) | 40 | 200 | 116 | 130 |
| Calibration or redundancy | Yes | Yes | No | No |

Ref1, Ref2 and Ref3 hereby refer to the following papers:

Ref1: B. Verbruggen et al., "*A 2.6 mW 6b 2.2 GS/s 4-times interleaved fully dynamic pipelined ADC in 40 nm digital CMOS,*" ISSCC Dig. Tech. Papers, pp. 296-297, February 2010.

Ref2: B. P. Ginsburg and A. P. Chandrakasan, "*Highly interleaved 5-bit, 250-MSamples/s, 1.2-mW ADC with redundant channels in 65-nm CMOS,*" IEEE J. Solid-State Circuits, vol. 43, no. 12, p. 2641, December 2008.

Ref3: Y.-Z. Lin, S.-J. Chang, Y.-T. Liu, C.-C. Liu and G.-Y. Huang, "*A 5b 800 MS/s, 2 mW asynchronous binary-search ADC in 65 nm CMOS,*" ISSCC Dig. Tec. Papers, pp. 80-81, February 2009.

What is claimed is:

1. An analog-to-digital converter (ADC) circuit configured to convert an analog input voltage signal (Vin) into a digital code representative of said analog input voltage signal (Vin), said ADC circuit comprising:

at least one input node configured to apply an analog input voltage signal (Vin);

a means for sampling said analog input voltage signal (Vin), yielding a sampled analog input voltage signal;

a first array of capacitors of substantially the same size configured to receive said sampled analog input voltage signal at the first terminals of said capacitors;

a digital delay line comprising a plurality of stages whereby the interconnections between consecutive stages form the second terminals of said capacitors of said first array, said digital delay line configured to be enabled by a clock generator and configured to generate a slope or staircase function by means of said first array of capacitors and said sampled analog input voltage signal; and a comparator configured to compare a converted signal with a reference voltage (Vref), said converted signal being said sampled analog input voltage converted according to said staircase or slope function, wherein the comparator is further configured to generate a stop signal to latch said delay line based on the comparison result, and wherein a digital code representative of said analog input voltage signal (Vin) is obtained from said digital delay line.

2. The ADC circuit of claim 1, further comprising at least a first capacitor connected to the first stage of the delay line, said first capacitor being programmable.

3. The ADC circuit of claim 1, further comprising:
a second input node configured to cooperate with said at least one input node for receiving a differential input voltage signal and whereby said means for sampling is configured for sampling said differential input voltage signal, yielding a sampled differential input voltage signal;
a second array of capacitors configured to cooperate with said first array of capacitors for receiving said sampled differential input voltage signal, said second array of capacitors being of substantially the same size as said first array of capacitors;
wherein the various stages of said digital delay line are also connected to said second array of capacitors and configured to generate a slope or staircase function by means of said first and second capacitor arrays; and
wherein said comparator is configured to compare the voltage on the first input node with the voltage on the second input node, and wherein said comparator is further configured to generate a stop signal to latch said delay line based on the comparison result thereby latching the digital delay line and thereby acquiring the digital code from said digital delay line.

4. The ADC circuit of claim 3, further comprising said at least a first capacitor and a second capacitor connected to said first stage of the delay line and arranged for redistributing the differential input signal thereby transforming the analog differential input voltage signal into a positive analog input voltage signal.

5. The ADC circuit of claim 1, implemented as a time-interleaved converter.

6. The ADC circuit of claim 1, further comprising a calibration circuit arranged for calibrating the comparator.

7. The ADC circuit of claim 6, wherein the calibration circuit comprises programmable capacitors.

8. The ADC circuit of claim 1, wherein the analog to digital converter further comprises a thermometer to gray encoder for encoding the digital code.

9. The ADC circuit of claim 1, wherein the analog to digital converter further comprises a thermometer to binary encoder for encoding the digital code.

10. The ADC circuit of claim 1, wherein the delay cells comprise dynamic memory elements.

11. A method for converting an analog input voltage signal into a digital representation of said analog input voltage signal, the method comprising the steps of:
sampling the analog input voltage signal applied onto an array of capacitors of substantially the same size via the first terminals of said capacitors;
enabling a digital delay line comprising a plurality of stages whereby the interconnections between consecutive stages form the respective second terminals of said capacitors of said first array, thereby producing a slope or staircase function by means of the array of capacitors and the sampled analog input voltage signal; and
comparing a converted signal with a reference voltage (Vref), said converted signal being said sampled analog input voltage converted according to said staircase or slope function, latching the delay line based on the outcome of the comparison, thereby obtaining a digital code representative of said analog input voltage signal, and storing the latched code obtained from said digital delay line.

* * * * *